US006954086B2

(12) United States Patent
Chen et al.

(10) Patent No.: US 6,954,086 B2
(45) Date of Patent: Oct. 11, 2005

(54) LOW POWER DATA STORAGE ELEMENT WITH ENHANCED NOISE MARGIN

(75) Inventors: David Jia Chen, Endwell, NY (US); Eugene James Nosowicz, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 10/665,653

(22) Filed: Sep. 18, 2003

(65) Prior Publication Data

US 2005/0075814 A1 Apr. 7, 2005

(51) Int. Cl.[7] .............................................. H03K 19/096

(52) U.S. Cl. ........................... 326/95; 326/93; 326/104; 327/202; 327/203

(58) Field of Search .............................. 326/93, 95, 98, 326/104, 108, 22, 23, 26–28; 327/202, 203, 208–218

(56) References Cited

U.S. PATENT DOCUMENTS 5,793,944 A * 8/1998 Luick .......................... 714/15
5,875,346 A * 2/1999 Luick ............................ 712/1
6,065,107 A * 5/2000 Luick .......................... 712/32
6,127,867 A * 10/2000 Coughlin et al. ........... 327/202
6,320,419 B1 * 11/2001 Burda et al. .................. 326/93
6,348,825 B1 * 2/2002 Galbi et al. ................. 327/218

* cited by examiner

*Primary Examiner*—Vibol Tan
(74) *Attorney, Agent, or Firm*—Fleit, Kain, Gibbons, Gutman, Bongini & Pianco P.L.

(57) ABSTRACT

A data storage element for use in LSSD compliant circuit designs. The data storage element has an alternate, or scan, data input circuit that has increased immunity to electrical noise while maintaining lower power consumption than the circuits used for primary data input. This increased noise immunity reduces the probably that noise on the alternate data input will cause an unintended change of data state stored in the data storage element. Modification of latch circuits used in the data storage element allow a reduction in the number of transistors used in the latch circuits, thereby compensating for the increase in transistors used in the alternate data input circuit and allowing the data storage element to use the same number of transistors as prior designs that have less noise immunity on their alternate data inputs.

9 Claims, 4 Drawing Sheets

400

500

PRIOR ART

400

LOW POWER DATA STORAGE ELEMENT WITH ENHANCED NOISE MARGIN

BACKGROUND OF THE INVENTION

1. Field of the Invention

This invention relates to digital circuitry and more specifically to data retaining circuit elements.

2. Description of Related Art

Electronic circuit designs are increasingly being optimized for lower power and smaller size requirements for better incorporation into integrated circuit designs. The increase in complexity and gate count within integrated circuits also requires that testability of the circuit be addressed in the designs of integrated circuits. One general methodology of integrated circuit testability is referred to as Level Sensitive Scan Design (LSSD). An LSSD circuit complies with a set of design rules that enhances the observablity and controllability of digital circuit elements so as to enhance testability of integrated circuits.

Data storage elements, which are circuits that retain a logical value, used in LSSD compliant circuits incorporate a design that allows data to be loaded into a storage element through an alternate data input. This alternate input is generally used for circuit test and stimulation. Loading a data storage element with a particular value allows, for example, placing a sequential logic circuit into a desired state. Data storage elements used in LSSD compliant circuits often have alternate data inputs that have a lower bandwidth than the primary data input in order to economize in power and circuit substrate size. This alternate input is sometimes referred to as a "scan input" since it allows a pre-defined state to be "scanned" into the sequential circuit using these data storage elements.

The alternate data input of data storage elements used in LSSD compliant circuits include an alternate data input and an alternate clock input. When the alternate clock input is at a logical low level, the alternate data input is inhibited and no change in storage element state is made. However, the circuit designs of conventional Data storage elements use an alternate data input structure that is somewhat susceptible to electrical noise on the alternate data input. A noise spike of sufficient amplitude on the alternate data input can cause the stored data state of the data storage element to change, even when the alternate clock input is at a logical low level.

A block diagram of a data storage element 100 used in LSSD compliant circuits is shown in FIG. 1. The exemplary data storage element 100 includes two latches, latch L1 114 and latch L2 118. Latch L1 114 has two sets of inputs, a primary input 106 that includes a primary data input D 102 and a primary clock input C 104. The exemplary data storage element 100 further includes an alternate input 112 with an alternate data input I 108 and an alternate clock input A 110. In normal operation of the data storage element 100, data is provided on the primary input D 102 and this data value is selected for storage into latch L1 114 upon a transition of the primary clock input C 104 from low to high. The data storage element is also able to select for storage data from the alternate data input 112 by providing a data value on the alternate data input I 108 and then causing this value to be stored into latch L1 114 upon a transition of the alternate clock input A 110. Once a data value is stored in L1 114, this value is available, after a propagation delay, at the L1 Output 116. The logical value that is present on the L1 Output 116 is stored into latch L2 118 upon a transition of clock B 120 from a logical low level to a logical high level. After the L1 Output 116 is stored into latch L2, that logic value is available, after a propagation delay, on the L2 output 122.

An exemplary prior art data storage element circuit 200 for the data storage element 100 is illustrated in FIG. 2. The prior art data storage element circuit 200 has a prior art latch L1 circuit 290, which performs the function of latch L1 114 of the data storage element 100, and a prior art latch L2 292, which performs the function of latch L2 116 of the data storage element 100. Of particular interest in this prior art data storage element circuit 200 is the circuit connected to the alternate input I 108. This circuit consists of a transmission gate formed by transistors TPAC 202 and TNAT 204. Electrical noise typically present on the alternate input I 108 presents a problem in this circuit design when the electrical noise has an amplitude large enough to cause the transmission gate formed by transistors TPAC 202 and TNAT 204 to turn on. In an example where is a logical high or "1" value stored in the prior art Latch L1 290 and the alternate clock A 110 is at a logical low value, then the state of the prior art Latch L1 290 should not change. However, if there is a negative spike on the alternate clock input 1110, it is possible for the voltage difference between the source and gate of transistor TNAT 204 to be larger than the threshold voltage of that transistor. Transistor TNAT 204 will then turn on and drain the charge holding the logical high value in prior art Latch L1 290. A similar scenario is possible with a logical low value is stored in prior art L1 290. In that case, the alternate data input I 108 could have a positive electrical noise spike that raises the voltage of the drain of transistor TPAC 202 above VDD by more than the threshold voltage. If the prior art Latch L1 290 is storing a logical low value, raising the drain of transistor TPAC 202 above VDD by more than the threshold voltage causes that value to be overwritten with a logical high value.

Alternative prior art designs that address this noise problem have attendant disadvantages. One prior art design to mitigate noise problems is reducing clock speed. Reducing clock speed has the undesirable effect of increasing the time required to perform testing of the circuit. Another prior art design to mitigate noise problems is to use inputs that incorporate a hysteresis so that the threshold level at which a data level change is recognized changes as a function of the level of the stored data. Hysteresis introduces additional circuit complexity and often increases power dissipation. Still another prior art design is to reduce the generation of noise on data lines by using "global wiring" techniques where circuit layouts for individual circuit modules within a circuit are able to extend beyond the physical area of the module itself. Combining global wiring techniques with circuit trace layout rules that prevent long lengths of parallel conductors results in circuits that have reduced noise spikes induced from other circuit traces. Global wiring techniques greatly increase the complexity of a circuit layout and are often difficult to implement and troubleshoot.

What is therefore needed is a data storage element design that includes an alternate data input structure that has increased immunity to noise on the alternate data input line when the alternate clock input is at a logical low level.

SUMMARY OF THE INVENTION

The exemplary embodiments of the present invention overcome the problems of the prior art by providing a data storage element for use in LSSD compliant circuits that provides increased immunity to electrical noise on the alternate data input. The exemplary embodiment of the present invention replaces the transmission-gate alternate data input circuit that is used in conventional Data storage elements with an inverter style alternate data input branch circuit.

Briefly, in accordance with the present invention, a data storage element has a primary data input and a primary clock input that selects storage of a level of the primary data input. The data storage element also has an alternate data input that is received by an inverter-style branch circuit. The data storage element further has an alternate clock input for selecting storage of a level of the alternate data input.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter which is regarded as the invention is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

DESCRIPTION OF THE PREFERRED EMBODIMENTS

The present invention, according to a preferred embodiment, overcomes problems with the prior art by providing a data storage element for use in LSSD compliant circuits that provides increased immunity to electrical noise on the alternate, or scan, data input. The exemplary embodiments of the present invention replaces the transmission-gate alternate data input circuit that is used in conventional data storage elements with an inverter style alternate, or scan, data input branch circuit. An exemplary embodiment further reduces the transistor count in other parts of the circuit to keep the total transistor count equal to that of prior art Data storage element designs.

Figure 1:
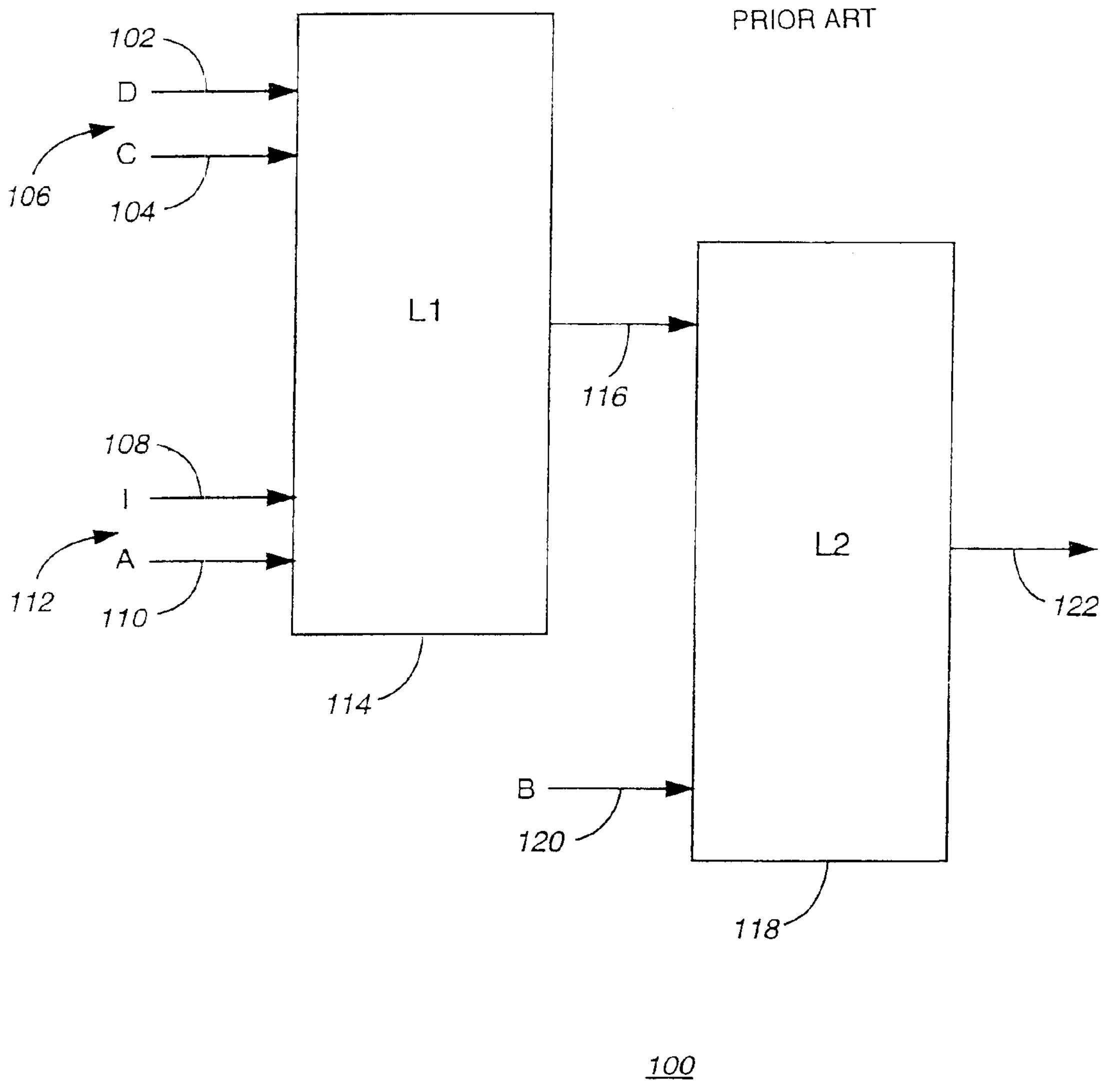
FIG. 1 is a block diagram of a data storage element for use in circuits that conform to LSSD design standards, as used by an exemplary embodiment of the present invention.
Figure 2:
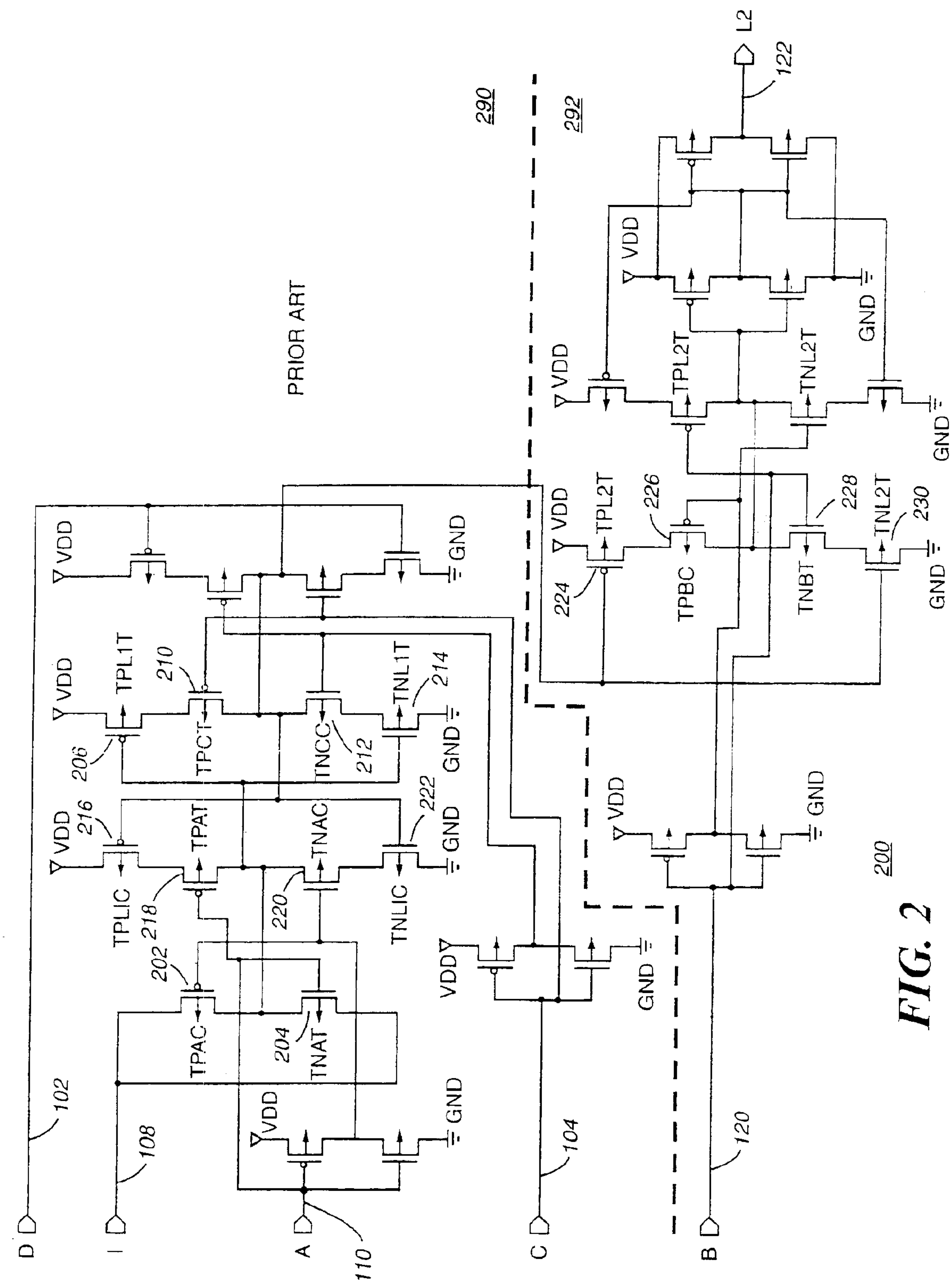
FIG. 2 is a circuit diagram depicting a prior art data storage element with a structure based upon the block diagram shown in FIG. 1.
Figure 3:
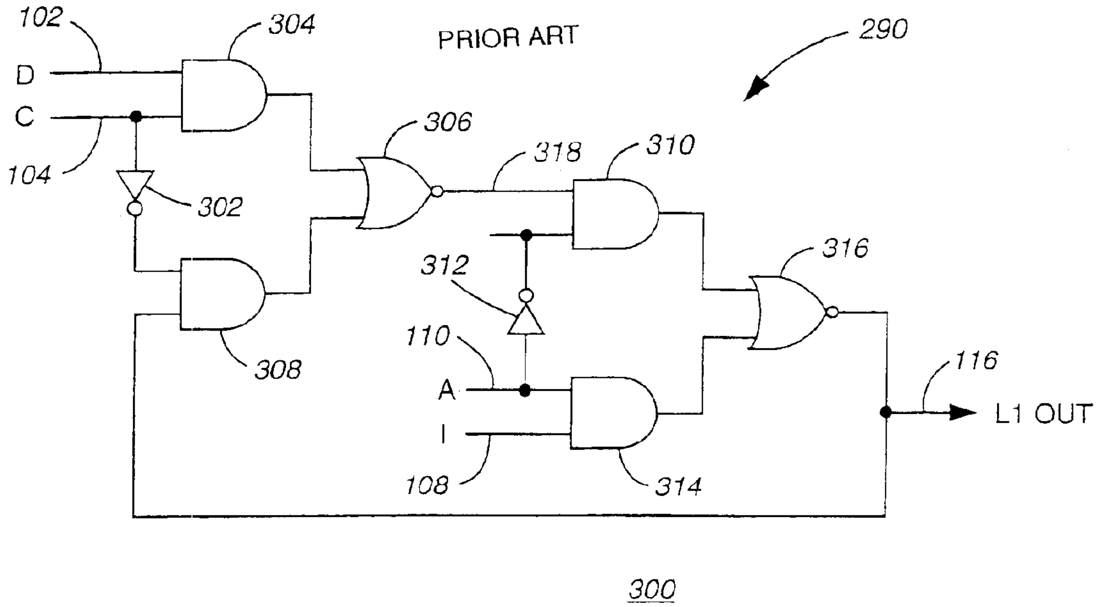
FIG. 3 is a logic diagram equivalent of the prior art data storage element shown in FIG. 2.

To facilitate a comparison of the prior art data storage element 200 to the exemplary embodiment of the present invention, a latch L1 logic diagram 300 schematic that represents the latch L1 of the prior art data storage element 200 is illustrated in FIG. 3. The equivalent latch L1 logic diagram 300 illustrates the logic gate equivalent of the circuit that is illustrated for the prior art latch L1 290. In the prior latch L1 logic diagram, the primary data input D 102 and primary clock input C 104 each drive an input of a first logic AND gate 304. The primary clock input C 104 is also inverted by a first inverter 302 and drives one input of a second logic AND gate 308. The other input of the second logic AND gate 308 is driven by the L1 Out 116 signal, which is the output of the prior art latch L1 290, thereby providing the feedback used to hold the data state of the prior art latch L1 290. The output of the first logic AND gate 304 and the second logic AND gate 308 each drive one input of a first logic NOR gate 306. The first logic NOR gate output 318 is the inverse of either the L1 Out 116 signal or the primary data input D 102 as is selected by the primary clock signal 104.

The alternate data input I 108 and the alternate clock input A 110 each drive an input of a first AND gate 314. The inverse of the alternate clock input A 110 also drives one input of a fourth logic AND gate 310. The outputs of the third logic AND gate 314 and the forth logic AND gate 310 each drive an input of a second logic NOR gate 316. The output of the second logic NOR gate 316 is either the first logic NOR gate output 318, which is described above, or the alternate data input I 108, as is selected by the level of the alternate clock input A 110. The output of the second logic NOR gate 316 provides the L1 Out signal 116 and is fed back into an input of the second logic AND gate 308 to provide the feedback used to store the data within the prior art latch L1 290. It is to be noted that the first AND gate 314 of the latch L1 logic diagram 300 can also advantageously be modified to include an embodiment of the present invention. Such an embodiment includes a modification of the first AND gate 314 to utilize a higher noise immunity input circuit similar to that used by the exemplary embodiment that is described below.

Figure 4:
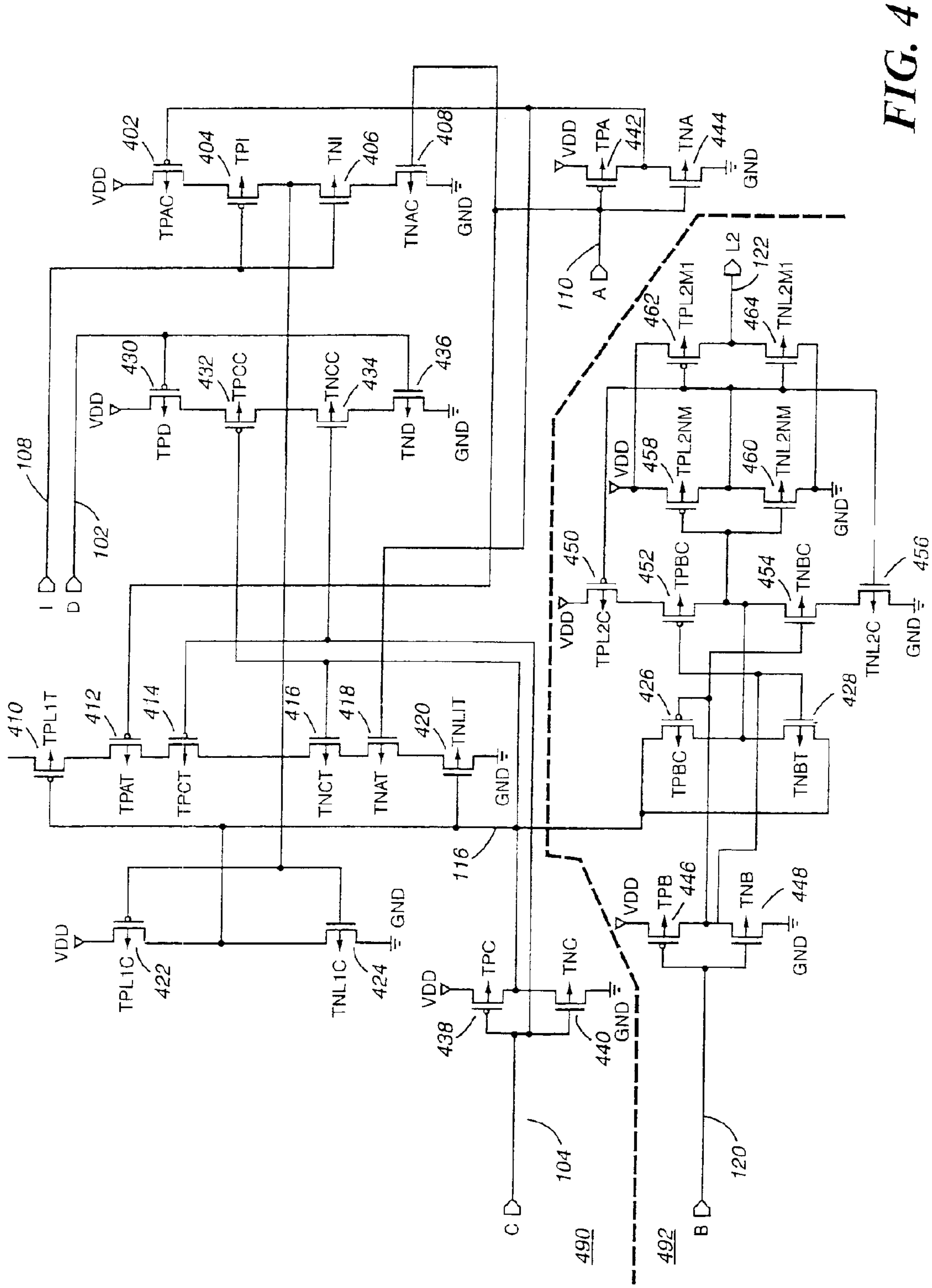
FIG. 4 is an enhanced noise immunity data storage element circuit, according to an exemplary embodiment of the present invention.

An enhanced noise immunity data storage element circuit 400 as is used by an exemplary embodiment of the present invention is illustrated in FIG. 4. The enhanced noise immunity data storage element circuit 400 is shown to consist of a new latch L1 490 and a new latch L2 492. The alternate data input I 108 in this circuit is connected to an inverter-style branch circuit that consists of transistor TPAC 402, TPI 404, TNI 406 and TNAC 408. This four transistor totem pole arrangement replaces the transmission gate formed by transistor pair TPAC 202 and TNAT 204 of the prior art data storage element circuit 200. The enhanced noise immunity data storage element circuit 400 includes additional transistors TNI 406 and TPI 404, which are driven by the levels of the alternate data input I 108. Transistors TPAC 402 and TNAC 408 of this totem pole are driven by clock alternate clock input A 110 and the inverse of alternate clock input A 110, respectively. This inverter-style branch circuit greatly enhances the immunity of the circuit to noise on the alternate data input I 108 over the prior art data storage element circuit 200 and advantageously reduces the susceptibility of the enhanced noise immunity data storage element 400 to change stored data states based upon noise that is present at the alternate data I input 108.

Some embodiments of the present invention only modify the prior art data storage element circuit 200 by changing the transmission gate connected to the alternate data input I 108 with the inverter-style branch circuit totem pole formed by transistor TPAC 402, TPI 404, TNI 406 and TNAC 408. Such embodiments exhibit the desired increase in immunity to electrical noise present on the alternate data input 108. The enhanced noise immunity data storage element circuit 400, however, incorporates further design modifications to reduce the number of transistors in the circuit. The number of transistors used in the enhanced noise immunity Data storage element circuit 400 is equal to the number of transistors used in the prior art data storage element circuit 200.

The enhanced noise immunity Data storage element circuit 400 reduces the transistor count by modifying the latch circuit designs used by new latch L1 490 and new latch L2 492. The enhanced noise immunity Data storage element circuit 400 latches data in new latch L1 490 with the latch circuit formed by transistors TPL1T 410, TPAT 412, TPCT 414, TNCT 416, TNAT 418, TNL1T 420, TPL1C 422 and TNL1C 424. These transistors perform similar functions to the transistors TPL1T 206, TPCT 210, TNCC 212, TNL1T 214, TPL1C 216, TPAT 218, TNAC 220, and TNL1C 222 of the prior art data storage element circuit 200. The enhanced noise immunity data storage element circuit 400 arranges TPL1T, TPAT 412, TPCT 414, TNCT 416 TNAT 418 and TNL1T 420 in a six transistor totem pole circuit. This arrangement allows the data input for latch L2 118, which is connected to the L1 output 116, of the enhanced noise immunity data storage element circuit 400 to be directly connected to the transistor pair TPBC 426 and TNBT 428, which form a gated input selected by the clock B 120 input. This results in the enhanced noise immunity data storage element circuit 400 effectively removing transistors TPL2T 224 and TNL2T 230 from the design of new latch L2 492 relative to the design of prior art latch L2 292 used in the prior art data storage element circuit 200. This two transistor reduction compensates for the addition of the two transistors to the alternate data input I 108 circuit described above and advantageously results in a transistor count for the enhanced noise immunity data storage element circuit 400 that is equal to the prior art data storage element circuit 200. This results in power dissipation and timing performance for the enhanced noise immunity Data storage element circuit 400 that is comparable to the prior art data storage element circuit 200.

The enhanced noise immunity Data storage element circuit 400 uses a gated input totem pole circuit to the primary data D 102 input. This input circuit consists of transistors TPD 430, TPCC 432, TNCC 434 and TND 436. The input circuit of the enhanced noise immunity data storage element circuit 400 for the primary clock C 104 input consists of transistor pair TPC 438 and TNC 440. The input circuit for the alternate clock A 110 consists of transistor pair TPA 442 and TNA 444.

The transistors used in the input circuits for the alternate data input I 108 and the alternate clock input 110 are able to have lower bandwidth, generally caused by higher channel pass resistance in the circuits and connections used for those circuits, since those circuits are used for the generally lower bandwidth test related signals. Using lower bandwidth circuits for alternate data and clock inputs reduces the use of larger, lower resistance and higher capacitance devices advantageously reduces power consumption and substrate die size for the overall circuit.

New latch L2 492 of the exemplary embodiment consists of the input transistors TPBC 426 and TNBT 428 as described above. The transistor pair consisting of TPB 446 and TNB 448 buffers the B clock input 120 of the enhanced noise immunity Data storage element circuit 400. A transition of the B clock 120 from low to high selects the latch L1 output 116 for storage into new latch L2 492. The data stored in new latch L2 492 is held in the transistor latch circuit formed by transistors TPL2C 450, TPBC 452, TNBC 454, TNL2C 456, TPL2NM 458 and TNL2NM 460, which is gated by the B clock input 120. The output 122 of the enhanced noise immunity data storage element 400 is the output of new latch L2 492 and is buffered by the output transistor pair formed by TPL2M1 462 and TPL2M1 464.

Figure 5:
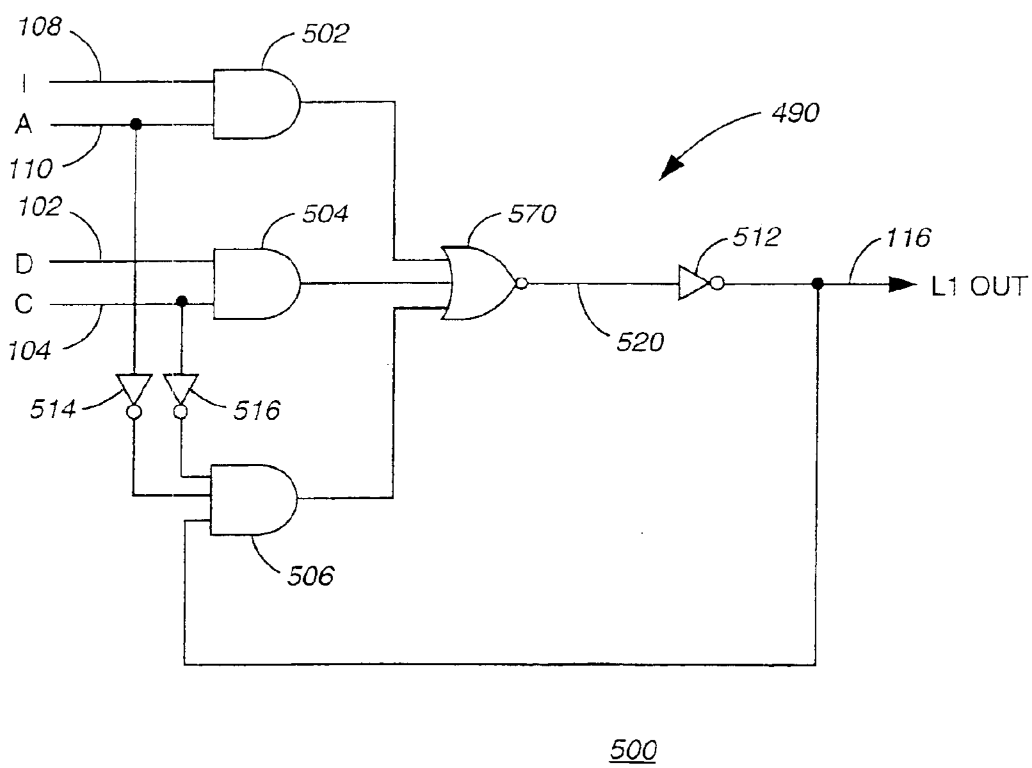
FIG. 5 is a logic diagram equivalent of the enhanced noise immunity data storage element circuit shown in FIG. 4, according to an exemplary embodiment of the present invention.

A new latch L1 logic diagram 500, which is an equivalent logic diagram for the new latch L1 490, is illustrated in FIG. 5. The alternate data input 108 and the alternate clock input 110 each drive an input of a first AND gate 502. The primary data input D 102 and the primary clock input C 104 each drive an input of a second AND gate 504. The primary clock input C 104 and the alternate clock input A 110 are each inverted, by a first inverter 516 and a second inverter 514, respectively, and each of these inverted clock signals drive an input of a three input AND gate 506. The remaining input of the three input AND gate 506 is driven by the L1 Out output 116, which is the output of the new latch L1 490, in order to provide the feedback used to retain the data level within the enhanced noise immunity Data storage element circuit 400. The outputs of the first AND gate 502, the second AND gate 504 and the three input AND gate 506 each drive one input of a three input NOR gate 510. The three input NOR gate output 520 is the inverse of either the primary data input D 102, the alternate data input I 108 or the output of the new latch L1 490, as is selected by the levels of the primary clock input C 104 and the alternate clock input A 110. The three input NOR gate output 520 is inverted by inverter 512 to produce the L1 Output 116, which is also fed back into the three input AND gate 506.

The data storage elements described above are incorporated into a wide variety of digital circuits. These data storage elements are included in libraries of pre-configured circuit modules, so-called "book sets," that are used by an integrated circuit designer when designing an integrated circuit to implement a more complex function. For example, data storage elements that conform to LSSD standards are selected from a library for use in integrated circuits that include arithmetic units and other processing circuits including registers and accumulators. It is apparent that all circuits using data storage elements and that conform to LSSD standards benefit from the use of the enhanced noise immunity Data storage element circuit 400 or similar embodiments of the present invention.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. The data storage element comprising:

a primary data input;

a primary clock input for selecting storage of a level of the primary data input;

an alternate data input, wherein the alternate data input is received by an inverter-style branch circuit;

an alternate clock input for selecting storage of a level of the alternate data input; and a first latch element for storing one of the primary data input and the alternate data input, the first latch element comprising:

a totem pole circuit including of at least six transistors, wherein two of the six transistors have a gate signal derived from the primary clock input and two of the six transistors have a gate signal derived from the alternate clock input.

2. The data storage element according to claim 1, further comprising a second latch element, wherein the second latch element selectively stores an output of the first latch element and the second latch element comprises a second latch data input circuit comprising a transmission gate.

3. The data storage element comprising:

a primary data input;

a primary clock input for selecting storage of a level of the primary data input;

an alternate data input, wherein the alternate data input is received by an inverter-style branch circuit; and an alternate clock input for selecting storage of a level of the alternate data input, wherein at least one of the alternate data input and the alternate clock input comprise circuits with lower bandwidths than at least one of the primary data input and the primary clock input.

4. The data storage element according to claim 3, wherein an input circuit of at least one of the alternate data input and the alternate clock input comprise transistors with higher pass resistance than an input circuit of at least one of the primary data input clock input.

5. An arithmetic unit comprising:

a data storage element, the data storage element comprising:

a primary data input;

a primary clock input for selecting storage of a level of the primary data input;

an alternate data input, wherein the alternate data input is received by an inverter-style branch circuit; and an alternate clock input for selecting storage of a level of the alternate data input, wherein at least one of the alternate data input and the alternate clock input comprise circuits with lower bandwidths than at least one of the primary data input and the primary clock input.

6. A library of integrated circuit modules, comprising:

a pre-defined data storage element, the pre-defined data storage element comprising:

a primary data input;

a primary clock input for selecting storage of a level of the primary data input;

an alternate data input, wherein the alternate data input is received by an inverter-style branch circuit; and an alternate clock input for selecting storage of a level of the alternate data input, wherein at least one of the alternate data input and the alternate clock input comprise circuits with lower bandwidths than at least one of the primary data input and the primary clock input.

7. A data storage element, comprising:

a first AND gate with a first input and a second input;

a second AND gate with a first input and a second input;

a third AND gate with a first input, a second input and a third input, wherein the first input of the third AND gate receives a signal corresponding to an inverted signal received by the second input of the first AND gate, the second input of the third AND gate receives a signal corresponding to an inverted signal received by the second input of the second AND gate and the third input receives an output of an inverter; and a NOR gate for receiving the outputs of each of the first AND gate, the second AND gate and a third AND gate and providing an output that is received by an input of the inverter.

8. The data storage element according to claim 7, wherein at the first input and the second input of the first AND gate receive an alternate data input and an alternate clock input and comprise circuits with lower bandwidths than the first input and the second input of the second AND gate.

9. The data storage element according to claim 8, wherein the circuits with lower bandwidth comprise transistors with higher pass resistance than circuits of the first input and the second input of the second AND gate.

* * * * *